United States Patent
Kwon et al.

(10) Patent No.: US 9,223,398 B2
(45) Date of Patent: Dec. 29, 2015

(54) FLEXIBLE DISPLAY APPARATUS AND METHOD OF OPERATING THE SAME

(71) Applicant: Samsung Display Co., Ltd., Yongin, Gyeonggi-Do (KR)

(72) Inventors: Jun-Il Kwon, Yongin (KR); Hui Nam, Yongin (KR); Beom-Shik Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 161 days.

(21) Appl. No.: 14/017,996

(22) Filed: Sep. 4, 2013

(65) Prior Publication Data
US 2014/0098040 A1  Apr. 10, 2014

(30) Foreign Application Priority Data
Oct. 8, 2012 (KR) .......................... 10-2012-0111420

(51) Int. Cl.
| | |
|---|---|
| G06F 1/16 | (2006.01) |
| G06F 3/01 | (2006.01) |
| G06F 3/041 | (2006.01) |
| H01L 27/32 | (2006.01) |
| H01L 51/56 | (2006.01) |

(52) U.S. Cl.
CPC *G06F 3/01* (2013.01); *G06F 3/041* (2013.01); *H01L 27/3244* (2013.01); *G06F 2203/04102* (2013.01); *G06F 2203/04108* (2013.01); *H01L 51/56* (2013.01); *H01L 2251/533* (2013.01)

(58) Field of Classification Search
CPC ..................... G06F 1/1652; G06F 2203/04102
See application file for complete search history.

(56) References Cited

U.S. PATENT DOCUMENTS

| | | | |
|---|---|---|---|
| 7,969,166 B2 | 6/2011 | Fasshauer | |
| 2008/0158172 A1 | 7/2008 | Hotelling et al. | |
| 2008/0303782 A1 | 12/2008 | Grant et al. | |
| 2011/0095975 A1* | 4/2011 | Hwang et al. | 345/156 |
| 2011/0181552 A1* | 7/2011 | Goertz et al. | 345/175 |
| 2012/0159364 A1 | 6/2012 | Hyun | |
| 2012/0162213 A1 | 6/2012 | Shim et al. | |

FOREIGN PATENT DOCUMENTS

| | | |
|---|---|---|
| KR | 10-2012-0066914 A | 6/2012 |
| KR | 10-2012-0072867 A | 7/2012 |

* cited by examiner

*Primary Examiner* — Kevin M Nguyen
(74) *Attorney, Agent, or Firm* — Robert E. Bushnell, Esq.

(57) ABSTRACT

Provided are a flexible display apparatus and a method of operating the same. The flexible display apparatus includes: a display unit that displays an image and is flexible; and a sensor for detecting an approach of an object to a bent space of the display unit while the display unit is bent. The flexible display apparatus may use a proximity touch as a user interface by detecting an approach of an object, by disposing a sensor in a region adjacent to a display unit or on the display unit.

20 Claims, 10 Drawing Sheets

FLEXIBLE DISPLAY APPARATUS AND METHOD OF OPERATING THE SAME

CLAIM OF PRIORITY

This application claims the benefit of Korean Patent Application No. 10-2012-0111420, filed on Oct. 8, 2012, in the Korean Intellectual Property Office, the disclosure of which is incorporated herein in its entirety by reference.

BACKGROUND OF THE INVENTION

1. Field of the Invention

The present invention relates to a flexible display apparatus and a method of operating the same, and more particularly, to a flexible display apparatus using bending of the flexible display apparatus as a user interface (UI), and a method of operating the flexible display apparatus.

2. Description of the Related Art

Generally, flat display apparatuses are classified into an emissive type and a passive type. Examples of an emissive display apparatus include an organic light-emitting display (OLED) device, a plasma display panel (PDP), a flat cathode ray tube (FCRT), a vacuum fluorescent display (VFD) panel, and a light-emitting diode (LED) panel, and an example of a passive display apparatus includes a liquid crystal display (LCD) panel.

Here, the OLED device has wide view angles, excellent contrast, and quick response speeds. Thus, the OLED device is widely used as a display device for a mobile device, such as a digital camera, a video camera, a camcorder, a portable information terminal, a smartphone, an ultra-slim laptop, or a tablet, or is widely applied to an electronic/electric product, such as an ultra-thin television.

Recently, flexible display apparatuses that are easily carried and applicable to an apparatus having any one of various shapes have been studied and developed as next-generation display apparatuses. Here, a flexible display apparatus based on OLED technology is considered to be the strongest display apparatus.

SUMMARY OF THE INVENTION

The present invention provides a flexible display apparatus using bending of a display unit as a user interface (UI), and a method of operating the flexible display apparatus.

The present invention also provides a flexible display apparatus using bending of a display unit as a UI that detects an approach of an object, and a method of operating the flexible display apparatus.

The present invention also provides a flexible display apparatus using a bending degree of a display unit as a UI, and a method of operating the flexible display apparatus.

According to an aspect of the present invention, there is provided a flexible display apparatus including: a display unit that is flexible and displays an image; and a sensor for detecting an approach of an object to a bent space of the flexible display apparatus while the display unit is bent.

The display unit may be repeatedly deformable to an unbent state and a bent state.

The display unit may be bendable in a predetermined curvature.

The sensor may detect whether the object approached a region extending from the sensor while overlapping with the display unit.

The sensor may transmit a sensing signal and receive the transmitted sensing signal.

The sensor may include: a transmitter for transmitting a sensing signal at a first edge region of the display unit; and a receiver for receiving the sensing signal at a second edge region facing the first edge region.

The transmitter may receive a signal reflected by the object from the sensing signal.

The sensor may include: a transceiver for transmitting and receiving a sensing signal at a first edge region of the display unit; and a reflector for reflecting the sensing signal at a second edge region facing the first edge region.

The flexible display apparatus may further include a determiner for determining at least one of an approach of the object based on the transmitted sensing signal and the received sensing signal, an approach location of the object, and a bending degree of the display unit.

The determiner may perform the determination by using at least one of a transmission time of the sensing signal, a reception time of the sensing signal, a strength of the transmitted sensing signal, and a strength of the received sensing signal.

The sensing signal may be light.

The flexible display apparatus may further include a controller for controlling the display unit by recognizing the approach of the object as a user interface.

The display unit may change an image displayed on the display unit or end an image display, according to the approach of the object.

The sensor may include: a first sensor for detecting the approach of the object at an edge of the display unit; and a second sensor for detecting the approach of the object between the edge and a center of the display unit.

An approach depth of the object may be detected by the first and second sensors.

The flexible display apparatus may further include a slab unit bending with the display unit. The slab unit may adhere to one surface of the display unit and having a curvature according to one direction.

The slab unit may include a shape variation unit for maintaining a streamlined cross section even when the display unit is unbent.

According to another aspect of the present invention, there is provided a method of operating a flexible display apparatus, the method including: detecting an approach of an object to a bent space of a display unit of the flexible display apparatus, while the display unit is bent; and changing an image displayed on the display unit or ending an image display on the display unit when it is determined that the object approached the bent space.

The detecting may include detecting an approach depth of the object.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

As the invention allows for various changes and numerous embodiments, particular embodiments will be illustrated in the drawings and described in detail in the written description. However, this is not intended to limit the present invention to particular modes of practice, and it will to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first", "second", etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having", etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As used herein, the term "and/or" includes any and all combinations of one or more of the associated listed items. Expressions such as "at least one of," when preceding a list of elements, modify the entire list of elements and do not modify the individual elements of the list.

A flexible display apparatus according to one or more embodiments of the present invention will be described below in more detail with reference to the accompanying drawings. Those components that are the same or are in correspondence are rendered the same reference numeral regardless of the figure number, and repeated descriptions thereof are omitted.

Figure 1:
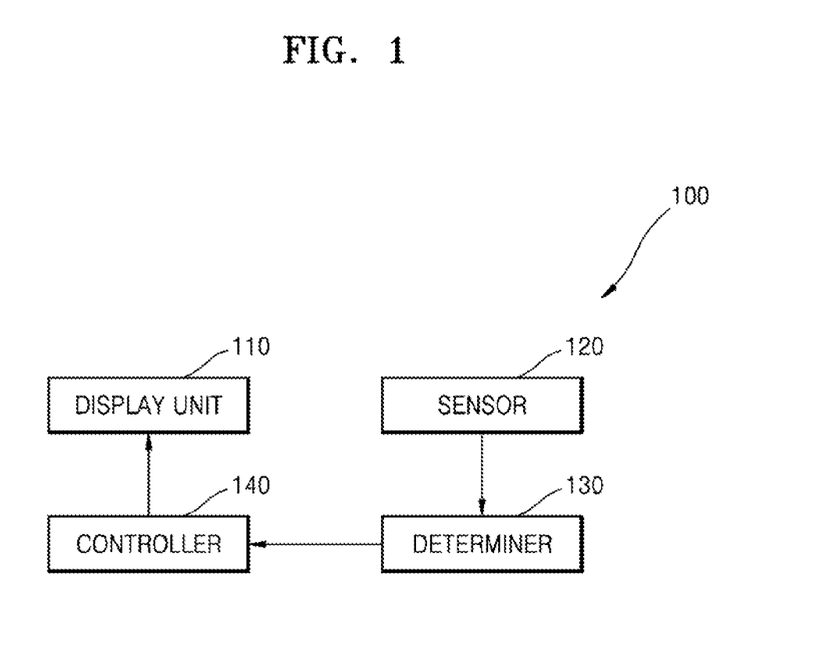
FIG. 1 is a block diagram of a flexible display apparatus according to an embodiment of the present invention.

FIG. 1 is a block diagram of a flexible display apparatus 100 according to an embodiment of the present invention.

As shown in FIG. 1, the flexible display apparatus 100 may include a display unit 110 that is flexible, a sensor 120 for transmitting and receiving a sensing signal, a determiner 130 for determining a bending degree of the flexible display apparatus 100, an approach of an object, or an approach location of the object, based on the sensing signal, and a controller 140 for not only controlling an overall operation of the flexible display apparatus 100, but also controlling the display unit 110 by recognizing the bending degree, the approach, or the approach location as a user interface (UI).

The display unit 110 externally displays an image, the sensor 120 may be disposed outside the display unit 110 since the sensor 120 detects the approach of the object from outside the flexible display apparatus 100, and the determiner 130 and the controller 140 may be disposed inside the flexible display apparatus 100.

Also, in the current embodiment, for convenience of description, the determiner 130 determining a detection result of the sensor 120 is described to be a separate component from the controller 140. However, the controller 140 may also perform operations of the determiner 130.

Figure 2A:
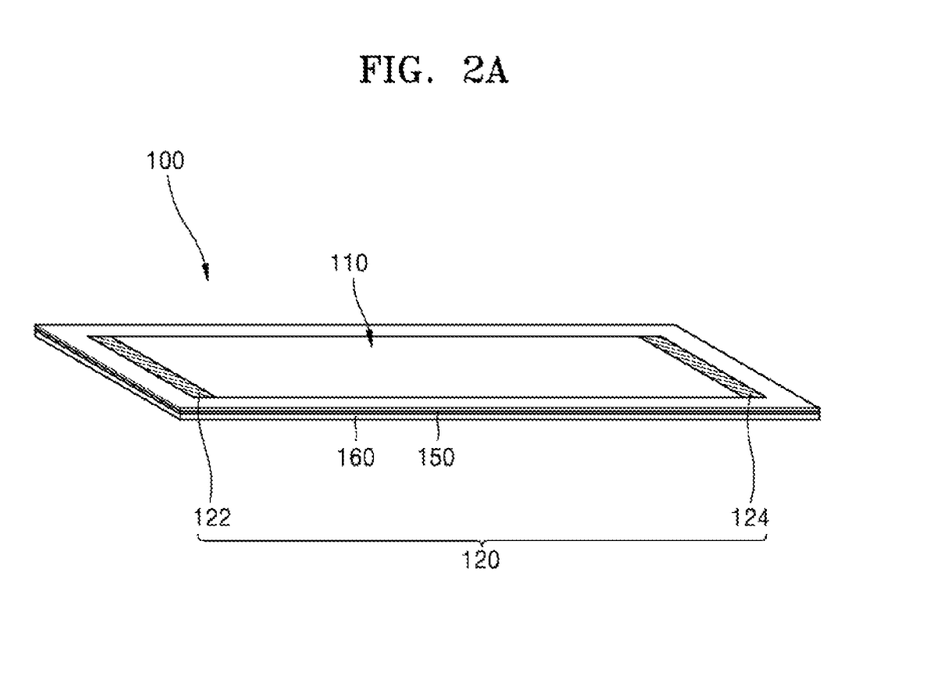
FIG. 2A is a perspective view of the flexible display apparatus of FIG. 1, which is unbent.
Figure 2B:
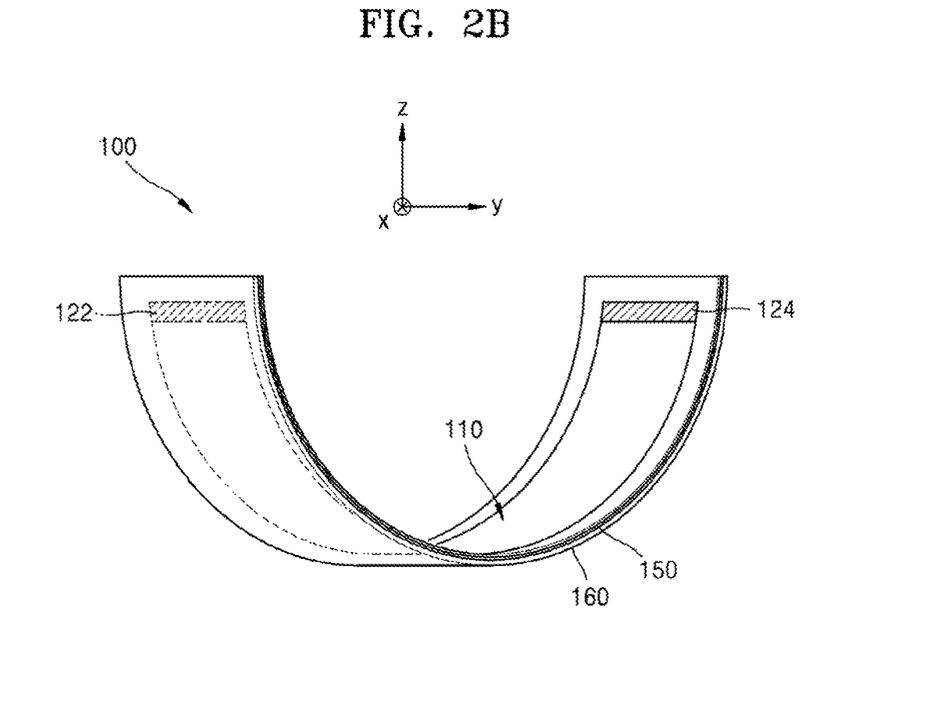
FIG. 2B is a cross-sectional view of the bent flexible display apparatus of FIG. 1.

FIG. 2A is a perspective view of the flexible display apparatus 100 of FIG. 1, which is unbent, and FIG. 2B is a perspective view of the bent flexible display apparatus 100 of FIG. 1.

Referring to FIGS. 2A and 2B, the flexible display apparatus 100 includes the display unit 110 that is flexible, and displays an image.

The display unit 110 includes organic light-emitting diode (OLED) and at least one thin-film transistor (TFT).

The flexible display apparatus 100 is an organic light-emitting display apparatus, but alternatively, may be another display apparatus, such as a liquid crystal display panel, a field emission display apparatus, an electroluminescent display apparatus, or an electrophoresis display apparatus.

The display unit 110 is combined to a touch screen, a display driver integrated circuit (DDI), a flexible printed circuit board (FPCB), a polarizing plate, or a window cover.

An edge of the display unit 110 may include the sensor 120 for transmitting and receiving a sensing signal so as to detect the approach of the object. The sensor 120 may include a transmitter 122 for transmitting a sensing signal and a receiver 124 for receiving the sensing signal, wherein the sensing signal may be an optical signal having linearity, such as infrared light or a laser beam.

A casing 150 for mounting the display unit 110 may be provided below the display unit 110. A material of the casing 150 is not limited as long as it is formed of a flexible material.

A slab unit 160 that bends with the display unit 110 is provided below the casing 150. The slab unit 160 is deformable while having a curvature along one direction. The display unit 110 is mounted on the slab unit 160 and has an unbent bar shape, but may realize an image while being bent in a partial oval shape and may be portable.

A user may bend the flexible display apparatus 100 by applying compressive stress to an edge region of the flexible display apparatus 110, or unbend the flexible display apparatus 100 by applying tensile stress to the edge region of the flexible display apparatus 100. As such, the flexible display apparatus 100 may be repeatedly deformed to a bent state and an unbent state according to stress.

For convenience of description, a width direction of the display unit 110 is referred to as an x-axis direction, a length direction of the display unit 110 when the display unit 110 is unbent is referred to as a y-axis direction, and a direction of bending the flexible display apparatus 100 is referred to as a z-axis direction.

Figure 3:
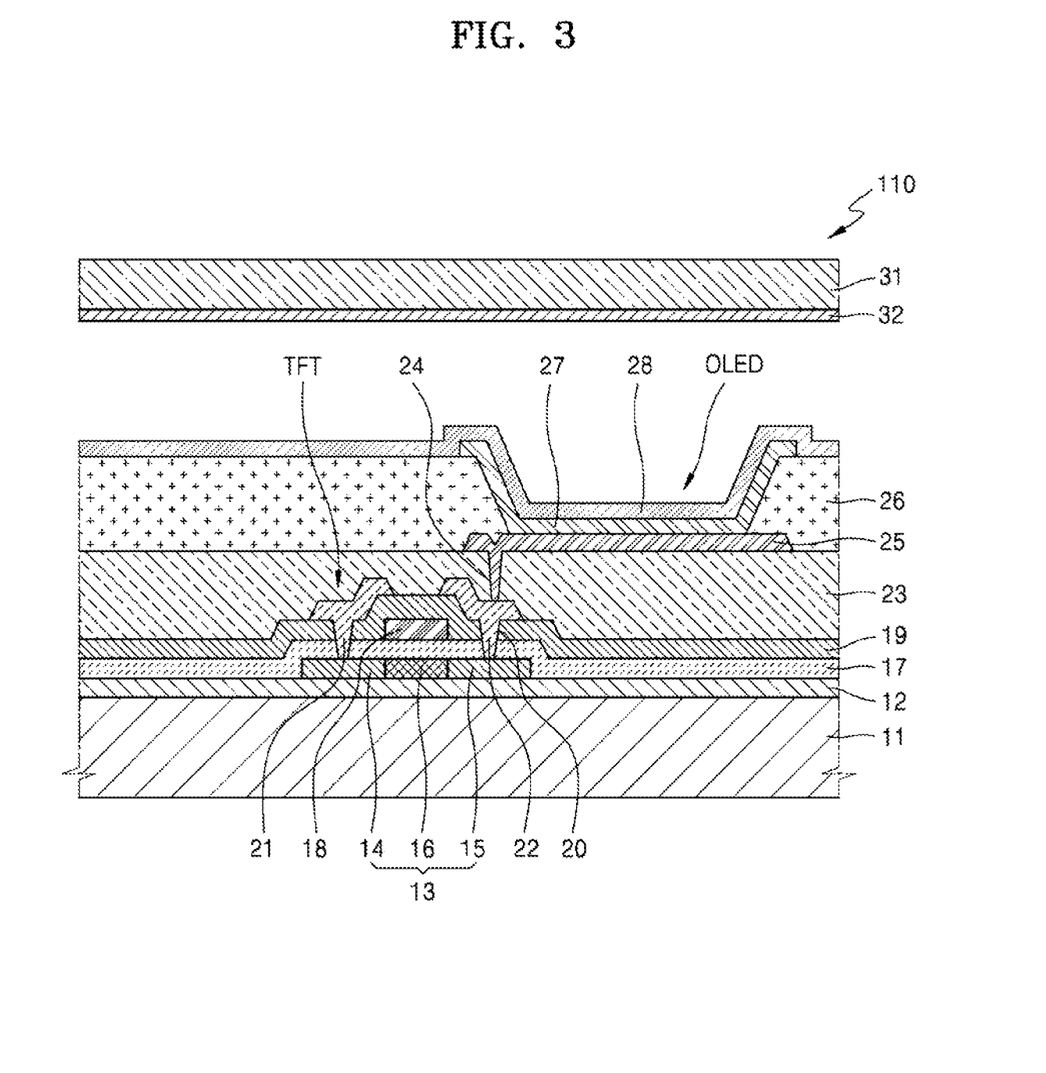
FIG. 3 is a diagram of a sub-pixel of a display unit of FIG. 1.

FIG. 3 is a diagram of a sub-pixel of the display unit 110 of FIG. 1.

Referring to FIG. 3, the display unit 110 includes a substrate 11. The substrate 11 is a flexible substrate. The substrate 11 may be formed of a material that is lighter than glass due to its low specific gravity, hardly breaks, and is flexible, for example, a polymer material, such as a flexible plastic film.

When the thickness of the substrate 11 is decreased, a weight of the substrate 11 is decreased and a thin display may be easily realized, as long as the substrate 11 has a thickness that supports the weight of devices and thin films formed on the substrate 11.

Accordingly, the substrate 11 may be a thin substrate having a thickness from about 10 μm to about 100 μm. When the thickness is lower than 10 μm, it may be difficult to stably maintain shapes of devices and thin films formed on the substrate 11. When the thickness is higher than 100 μm, it may be difficult to maintain the flexibility of the substrate 11.

The substrate 11 may be formed of a polymer material, such as polyimide (PI), polycarbonate (PC), polyethersulphone (PES), polyethylene terephthalate (PET), polyethylene naphthalate (PEN), polyarylate (PAR), or fiber glass reinforced plastic (FRP).

A first barrier layer 12 is formed on the substrate 11. The first barrier layer 12 may be formed of an inorganic material, such as SiOx, SiNx, SiON, AlO, or AlON, an organic material, such as acryl or polyimide, or an organic material and an inorganic material, which are alternately stacked on each other. The first barrier layer 12 blocks oxygen and moisture, prevents moisture and impurities generated from the substrate 11 from being diffused, and helps crystallization of a semiconductor by adjusting a transfer speed of heat during the crystallization.

A TFT is formed on the first barrier layer 12. In the current embodiment, the TFT is a top gate TFT. However, alternatively, the TFT may have another structure, such as a bottom gate structure.

A semiconductor active layer 13 is formed on the first barrier layer 12. When the semiconductor active layer 13 is formed of polysilicon, amorphous silicon may be formed and crystallized to form polysilicon.

Examples of a method of crystallizing amorphous silicon include a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method, but in the current embodiment, a method that does not require a heating process at a high temperature may not be used in order to use the substrate 11.

For example, during crystallization of low temperature polysilicon (LTPS), the semiconductor active layer 13 is activated by irradiating a laser beam for a short period of time so as to remove a time of exposing the substrate 11 to a high temperature equal to or higher than 300° C., and thus an overall operation may be performed at a temperature lower than 300° C. Accordingly, the TFT may be formed by using the substrate 11 that is flexible and is formed of a polymer material.

A source region 14 and a drain region 15 are formed in the semiconductor active layer 13 by doping ions of an N-type or a P-type impurity. A channel region 16 that is not doped with an impurity is disposed between the source region 14 and the drain region 15.

A gate insulation film 17 is deposited on the semiconductor active layer 13. The gate insulation film 17 has a structure of a single layer formed of $SiO_2$, or a double layer formed of $SiO_2$ and $SiN_x$.

A gate electrode 18 is formed on a predetermined region of the gate insulation film 17. The gate electrode 18 is connected to a gate line (not shown) for applying a TFT on/off signal. The gate electrode 18 may be formed of a single metal or metals, and may be a multi-layer formed of Mo, MoW, Cr, Al, Mg, Ni, W, Au, or a combination thereof.

An interlayer insulation film 19 is formed on the gate electrode 18, and has contact holes 20 through which a source electrode 21 is electrically connected to the source region 14, and a drain electrode 22 is electrically connected to the drain region 15.

The interlayer insulation film 19 may be formed of an insulation material, such as $SiO_2$ or $SiN_x$, or may be formed of an insulation organic material. The contact hole 20 may be formed by selectively removing a part of the gate insulation film 17 and a part of the interlayer insulation film 19.

A protection film (passivation film and/or planarization film) 23 is formed on the source electrode 21 and the drain electrode 22. The protection film 23 protects and planarizes the TFT therebelow. A configuration of the protection film 23 may vary, for example, the protection film 23 may be formed of an organic material, such as benzocyclobutene (BCB) or acryl, or an inorganic material, such as SiNx, and may be formed in a single layer, a double layer, or a multi-layer.

A display device is formed on the TFT. In the current embodiment, the display unit 110 includes an OLED, but it is not limited thereto and any one of various display devices may be used.

In order to form an OLED on the TFT, a first electrode 25 is electrically connected to one of the source electrode 21 and the drain electrode 22 through a contact hole 24.

The first electrode 25 operates as an anode between electrodes included in the OLED, and may be formed of any one of various conductive materials. The first electrode 25 may be a transparent electrode or a reflective electrode, depending on the OLED.

For example, when the first electrode 25 is a transparent electrode, the first electrode 25 may be formed of ITO, IZO, ZnO, or $In_2O_3$, and when the first electrode 25 is a reflective electrode, the first electrode 25 may be formed by forming a reflective film by using Ag, Mg, Al, Pt, Pd, Au, Ni, Nd, Ir, Cr, or a compound thereof, and then disposing ITO, IZO, ZnO, or $In_2O_3$ thereon.

A pixel-defining layer (PDL) 26 is formed on the protection film 23, wherein the PDL 26 is formed of an organic material to cover a part of the first electrode 25 of the OLED.

An intermediate layer 27 is formed on a part of the first electrode 25, which is externally exposed by etching a part of the PDL 26. The intermediate layer 27 includes at least an organic light-emitting layer so as to emit visible rays.

A second electrode 28 of the OLED is formed on the intermediate layer 27.

Voltages having different polarities are applied to the intermediate layer 27 so that the intermediate layer 27 emits light.

In the current embodiment, the intermediate layer 27 is a pattern that corresponds to only to each sub-pixel, i.e., each first electrode 25 that is formed by patterning. However, the current embodiment is only an example for conveniently describing a structure of sub-pixels, and thus the intermediate layer 27 may be integrally formed with the intermediate layer 27 of an adjacent sub-pixel. Alternatively, some intermediate layers 27 may be formed according to sub-pixels and other intermediate layers 27 may be integrally formed with the intermediate layers 27 of adjacent sub-pixels.

The organic light-emitting layer of the intermediate layer 27 may be formed of a low molecular organic material or a high molecular organic material.

When the organic light-emitting layer of the intermediate layer 27 is formed of a low molecular organic material, the intermediate layer 27 may have a single or complex structure of a hole injection layer (HIL), a hole transport layer (HTL), an emissive layer (EML), an electron transport layer (ETL), and an electron injection layer (EIL), which are stacked on each other.

Also, examples of the low molecular organic material used for the intermediate layer 27 include copper phthalocyanine (CuPc), N,N'-Di(naphthalene-1-yl)-N,N'-diphenyl-benzidine (NPB), and tris-8-hydroxyquinoline aluminum (Alq3). The low molecular organic material may be formed via a vacuum deposition method using masks.

When the organic light-emitting layer of the intermediate layer 27 is formed of a high molecular organic material, the intermediate layer 27 may have a structure including an HTL and an EML. Here, the HTL may be formed of PEDOT, and the EML may be formed of a polyphenylene vinylene (PPV)-based or a polyfluorene-based high molecular organic material. Such a high molecular organic material may be formed by a screen printing method or an inkjet printing method. However, the intermediate layer 27 is not limited thereto and may vary.

Like the first electrode 25, the second electrode 28 may be a transparent electrode or a reflective electrode.

When the second electrode 28 is a transparent electrode, the second electrode 28 may be formed by depositing a metal having a low work function, such as Li, Ca, LiF/Ca, LiF/Al, Al, Mg, or a compound thereof, on the intermediate layer 27, and then forming a subsidiary electrode formed of a transparent electrode-forming material, such as ITO, IZO, ZnO, or $In_2O_3$, thereon.

When the second electrode 28 is a reflective electrode, the second electrode 28 may be formed by depositing Li, Ca, LiF/Ca, LiF/Al, Al, Mg, or a compound thereof on an entire surface of the intermediate layer 27.

When the first electrode 25 is formed of a transparent electrode or a reflective electrode, the first electrode 25 may be formed in a shape corresponding to an opening of each sub-pixel. The second electrode 28 may be formed by depositing a transparent or reflective electrode on an entire surface of a display region. However, the second electrode 28 may not be deposited on the entire surface of the display region, and may have any one of various patterns. Here, locations of the first and second electrodes 25 and 28 may be switched.

An encapsulation substrate 31 is combined to the top of the OLED. The encapsulation substrate 31 may be substantially formed of the same material as the substrate 11. The encapsulation substrate 31 is a film that is easily bendable. Alternatively, the OLED may be encapsulated by forming an organic and/or inorganic film on the OLED after forming the OLED.

A second barrier layer 32 may be further formed on one surface of the encapsulation substrate 31 facing the second electrode 28. The second barrier layer 32 may be formed of an inorganic material, such as SiOx, SiNx, SiON, AlO, or AlON, an organic material, such as acryl or polyimide, or both the inorganic material and the organic material that are alternately stacked on each other.

Figure 4:
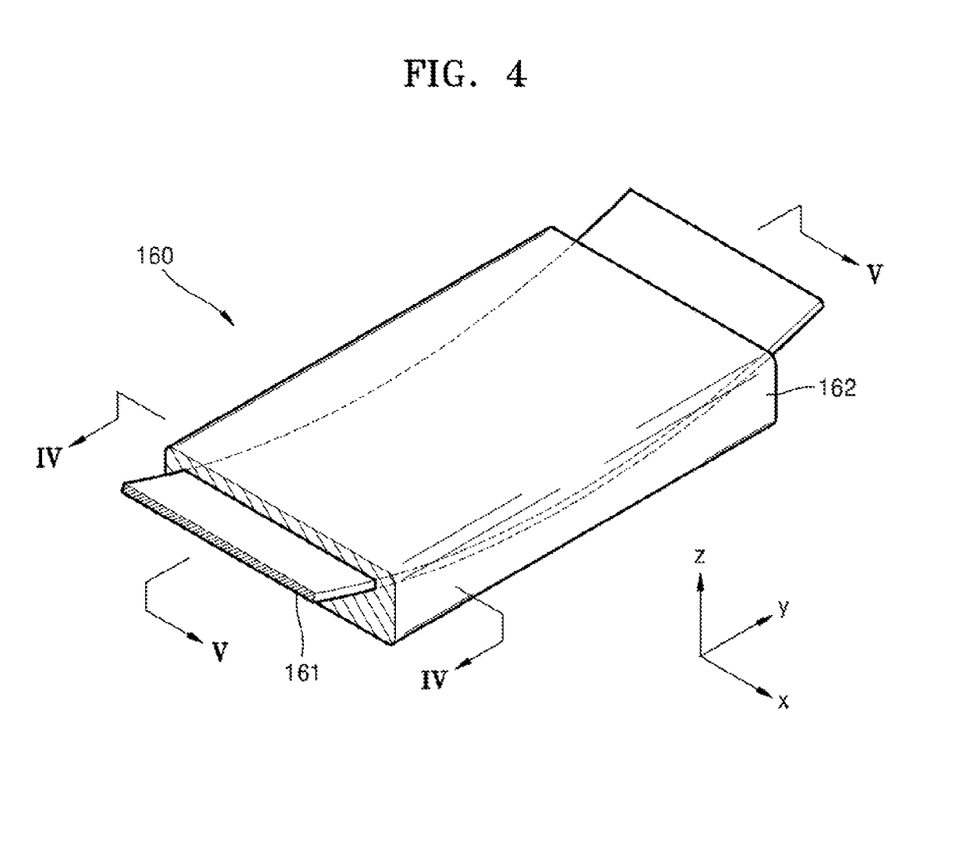
FIG. 4 is a perspective view of a slab unit of FIG. 1, which is partially cut.

FIG. 4 is a perspective view of the slab unit 160 of FIG. 1, which is partially cut.

Referring to FIG. 4, the slab unit 160 includes a shape variation unit 161 and a housing unit 162.

The slab unit 160 may have a curved shape so as to maintain a stable state both in an unbent state and a bent state. For example, the shape variation unit 161 has a streamlined cross section in a z-axis direction. In the current embodiment, the shape variation unit 161 has a cross section of U shape, but alternatively, it may have a cross section of another shape, such as a wavy shape. The shape variation unit 161 may be formed of a flexible metal thin plate.

The shape variation unit 161 may only be deposited on one surface of the display unit 110 of FIG. 1, but alternatively, may be surrounded by the housing unit 162 so as to reduce deformation. The housing unit 162 is formed of an elastic material, such as silicon or rubber. Alternatively, an adhesive layer formed of an elastic material may be formed between the display unit 110 and the shape variation unit 161.

Since the housing unit 162 surrounds the shape variation unit 161, unnecessary deformation of the flexible display apparatus 100 that is caused by a difference between the radii of curvature of the shape variation unit 161 and the display unit 110 may be reduced.

Also, when the flexible display apparatus 100 is deformed, a difference between an inner circumference and an outer circumference of the shape variation unit 161 is offset by the elasticity of the housing unit 162, and thus unnecessary bending does not occur while the flexible display apparatus 100 is unbent or bent.

The housing unit 162 surrounds the shape variation unit 161, and has a flat surface when the flexible display apparatus 100 is unbent such that the display unit 110 maintains a completely unbent state. Accordingly, the housing unit 162 may have a thickness that surrounds an entire region of the shape variation unit 161 while enabling the entire slab unit 160 to maintain a uniform thickness.

Alternatively, the housing unit 162 may have a quadrangular outer shape while having different thicknesses from a center to an edge of the shape variation unit 161.

Figure 5A:
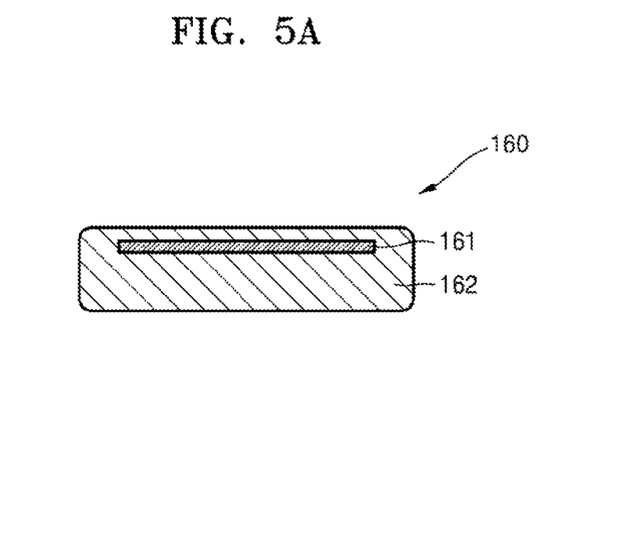
FIG. 5A is a cross-sectional view taken along line IV-IV while the slab unit of FIG. 4 is unbent.
Figure 5B:
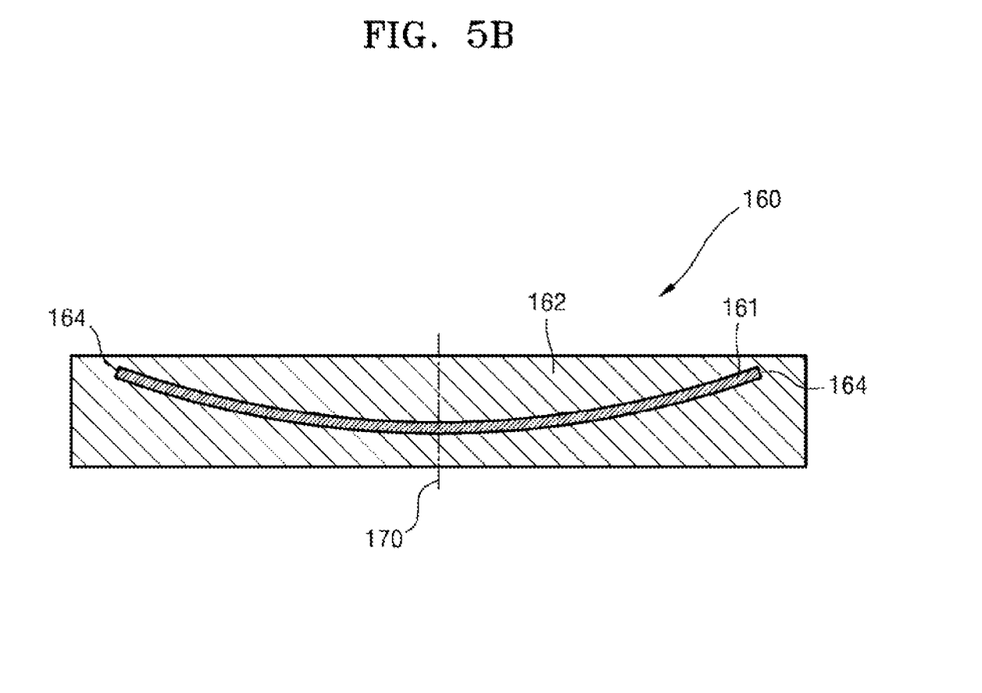
FIG. 5B is a cross-sectional view taken along line V-V while the slab unit of FIG. 4 is unbent.

FIG. 5A is a cross-sectional view taken along line IV-IV while the slab unit 160 of FIG. 4 is unbent, and FIG. 5B is a cross-sectional view taken along line V-V while the slab unit 160 of FIG. 4 is unbent.

Referring to FIGS. 5A and 5B, when the slab unit 160 is in the unbent state, the shape variation unit 161 maintains a linear side surface in a width direction while maintaining a streamlined cross section in a length direction.

The shape variation unit 161 is curved from a center 170 to edges 164 of the shape variation unit 161. The shape variation unit 161 may have a predetermined curvature. The shape variation unit 161 may have a U-shape cross section. Here, the center 170 of the shape variation unit 161 matches the center of the display unit 110.

As such, since the shape variation unit 161 has the U-shape cross section even when the display unit 110 is unbent, the shape variation unit 161 may guide a bending direction of the flexible display apparatus 100, and thus a state of the flexible display apparatus 100 may be easily changed.

Figure 6:
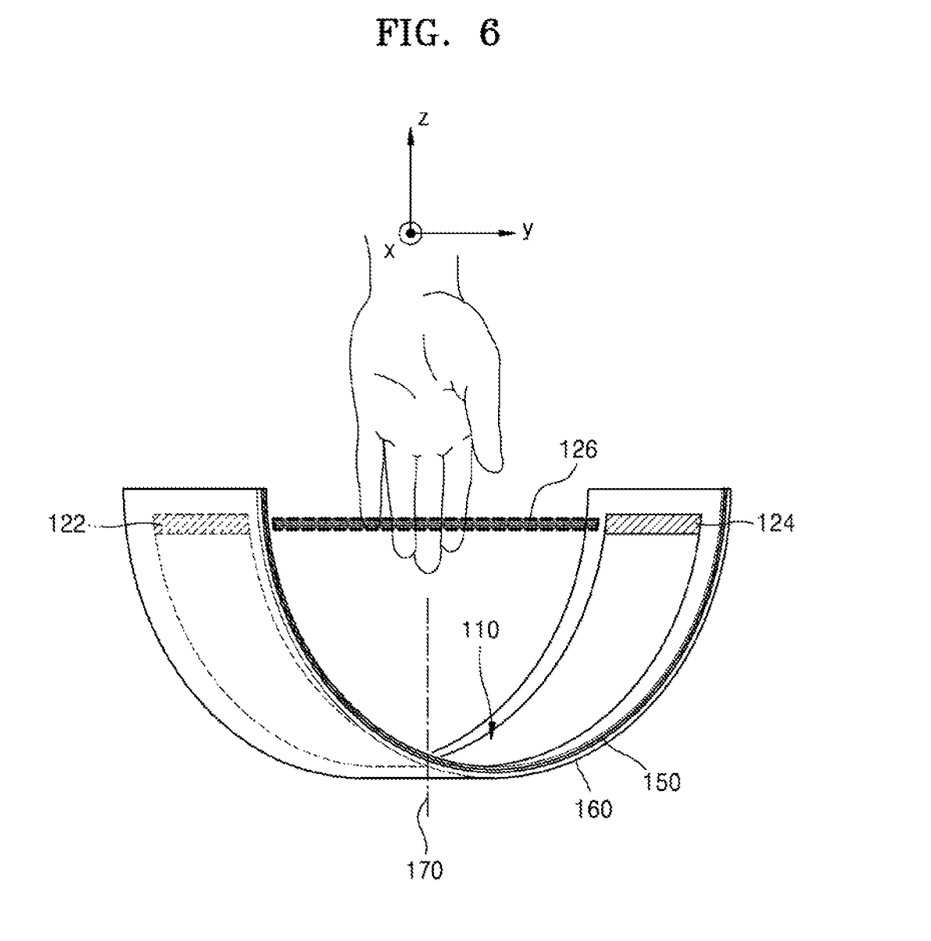
FIG. 6 illustrates a sensing region of a sensor while the flexible display apparatus is bent.

FIG. 6 illustrates a sensing region 126 of the sensor 120 while the display unit 110 is bent. As shown in FIG. 6, the sensor 120 may include the transmitter 122 for transmitting a sensing signal at a first edge of the display unit 110, and a receiver 124 for receiving the sensing signal at a second edge of the display unit 110 facing the first edge. The transmitter 122 may transmit the sensing signal towards the receiver 124 in a y-axis direction that is perpendicular to the bending direction. The sensing signal may be a linear optical signal, such as infrared light or a laser beam.

The receiver 124 may receive the sensing signal from the transmitter 122 when the display unit 110 is bent in a U shape based on the center 170 of the display unit 110. Here, a region between the transmitter 122 and the receiver 124 is referred to as the sensing region 126. The sensing region 126 is a region overlapping the display unit 110 while extending from the sensor 120 in a direction perpendicular to a z-axis direction. Also, a bent space of the display unit 110, while the display unit 110 is bent, is a space between the display unit 110 and the sensing region 126. In other words, the bent space is a space surrounded by the display unit 110 and the sensing region 126 when the display unit 110 is bent. Also, the determiner 130 may determine a bending degree or an approach of an object to the display unit 110 based on the sensing signal.

In detail, the determiner 130 may determine a bending degree of the display unit 110 from a difference between a transmission time of the sensing signal from the transmitter 122 and a reception time of the sensing signal in the receiver 124. For example, when the difference is small, the bending degree is high.

Also, when an object approaches the sensing region 126, the sensing signal transmitted from the transmitter 122 is reflected by the object. Accordingly, the receiver 124 receives a sensing signal having low strength, and thus the determiner 130 may determine whether the object approached the sensing region 126 based on the strength of the sensing signal.

When the transmitter 122 receives the sensing signal reflected from the object, the determiner 130 may determine an approach location of the object in a y-axis direction based on the transmission time of the sensing signal from the transmitter 122 to a reception time of the reflected sensing signal.

In the current embodiment, the transmitter 122 is disposed at the first edge, and the receiver 124 is disposed at the second edge, but an embodiment of the present invention is not limited thereto. In other words, a sensor for transmitting or receiving a sensing signal may be disposed at the first edge, and a reflector (not shown in drawings) for reflecting the sensing signal to the sensor may be disposed at the second edge.

The sensor 120 may include a plurality of unit sensors. For example, the transmitter 122 may include a plurality of unit transmitters disposed in a line at the first edge, and the receiver 124 may include a plurality of receivers disposed in a line at the second edge. Also, each unit transmitter transmits a sensing signal to a corresponding unit receiver, and each unit receiver applies the received sensing signal to the determiner 130. Accordingly, the determiner 130 may determine the approach location of the object in the width direction, i.e., an x-axis direction from a unit receiver that received the sensing signal having weak strength.

As such, since the sensor 120 is disposed at an edge of the display unit 110 to determine the approach of the object to the sensing region 126, a user interface may be realized even via an approach wherein the display unit 110 is not directly touched.

Accordingly, the controller 140 may control the display unit 110 to display an image or end an image display by recognizing the approach of the object and the approach location of the object as a user interface.

In addition, a 3-dimensional (3D) user interface may also be realized by sensing an approach depth of the object.

Figure 7:
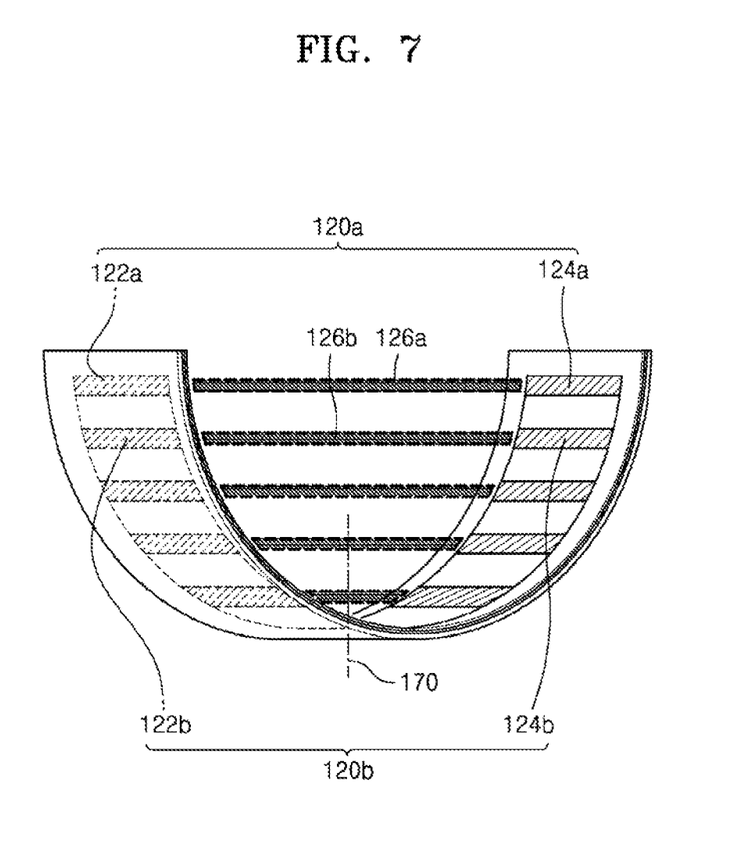
FIG. 7 is a view for describing a sensor sensing an approach depth of an object, according to an embodiment of the present invention.

FIG. 7 is a view for describing the sensor 120 sensing an approach depth of an object, according to an embodiment of the present invention.

As shown in FIG. 7, a plurality of sensors, for example, may include a first sensor 120a and a second sensor 120b and so on. The first sensor 120a may be disposed at an edge of the display unit 110, and the second sensor 120b may be disposed in a region of the display unit 110 between the first sensor 120a and the center 170 of the display unit 110. Also, the first sensor may include a transmitter 122a and a receiver 124a, and the second sensor may include a transmitter 122b and a receiver 124b. Each of the first and second sensors 120a and 120b may transmit and receive a sensing signal to set a plurality of sensing regions having different depths, for example, a first sensing region 126a and a second sensing region 126b.

The first and second sensors 120a and 120b may sense an approach depth, an approach location, etc. of an object based on whether the object entered the corresponding first and second sensing regions 126a and 126b. Accordingly, the controller 140 may control an image display on the display unit 110 by recognizing the approach depth of the object as a 3D user interface. In other words, the controller 140 may change a mode of a display apparatus.

In the current embodiment, a sensor detects an approach of an object by using light, but alternatively, a sensor may use an electric field or a magnetic field.

Also, a user interface is realized according to a proximity touch while the display unit 110 is bent, but an embodiment of the present invention is not limited thereto. In other words, a user interface may be realized by using a bending degree of the flexible display apparatus 100.

For example, when a transmitter disposed at a first edge of the display unit 110 transmits a sensing signal while the display unit 110 is bent in a U shape based on the center 170 of the display unit 110, a receiver disposed at a second edge of the display unit 110 facing the first edge may receive the sensing signal. The display unit 110 may be repeatedly deformed in an unbent state and a bent state, and may be bent to have a predetermined curvature.

The sensing signal may be an optical signal having linearity, such as infrared light or a laser beam. Also, the determiner 130 may determine the bending degree of the display unit 110 from a difference between the transmission time of the sensing signal from the transmitter 122 and the reception time of the sensing signal in the receiver 124. When the difference is small, i.e., when a distance between the transmitter 122 and the receiver 124 is small, the bending degree of the display unit 110 is high.

As such, the controller 140 may control the display unit 110 to display an image or end an image display by recognizing the bending degree as a user interface. For example, when the distance between the transmitter 122 and the receiver 124 is less than or equal to a predetermined distance, the controller 140 may change an image displayed on or change the image displayed on the display unit 110. In other words, the controller 140 may change a mode of the flexible display apparatus 100 to, for example, a call mode, a scheduling mode, or an image display mode. The predetermined distance may be half of a distance between the edges of the display unit 110 when the display unit 110 is unbent, or a distance when edges of the flexible display apparatus 100 contact each other.

In addition, the controller 140 may change an image displayed on the display unit 110, or display the image on the display unit 110 according to the distance between the transmitter 122 and the receiver 124. For example, when the distance is equal to a first distance, the controller 140 may set the mode to a first mode (for example, a call mode), and when the distance is equal to a second distance that is shorter than the first distance, the controller 140 may set the mode to a second mode (for example, a scheduling mode).

In the current embodiment, the transmitter 122 and the receiver 124 are both disposed at the edge of the display unit 110, but alternatively, at least one of the transmitter 122 and the receiver 124 may be disposed at the edge of the display unit 110. For example, the transmitter 122 may be disposed at the edge of the display unit 110, whereas the receiver 124 may be disposed in an edge other than the edge where the transmitter 122 is disposed.

In the current embodiment, the transmitter 122 for transmitting the sensing signal is disposed at the first edge of the display unit 110 and the receiver 124 for receiving the sensing signal is disposed at the second edge of the display unit 110, but alternatively, a sensor for transmitting or receiving a sensing signal may be disposed at the first edge of the display unit 110, and a reflector for reflecting the sensing signal to the sensor may be disposed at the second edge of the display unit 110.

Also, the sensor at an edge of the flexible display apparatus 100 may detect whether the edges of the flexible display apparatus 100 are combined to each other or whether the flexible display apparatus 100 is contacting an external apparatus.

Figure 8A:
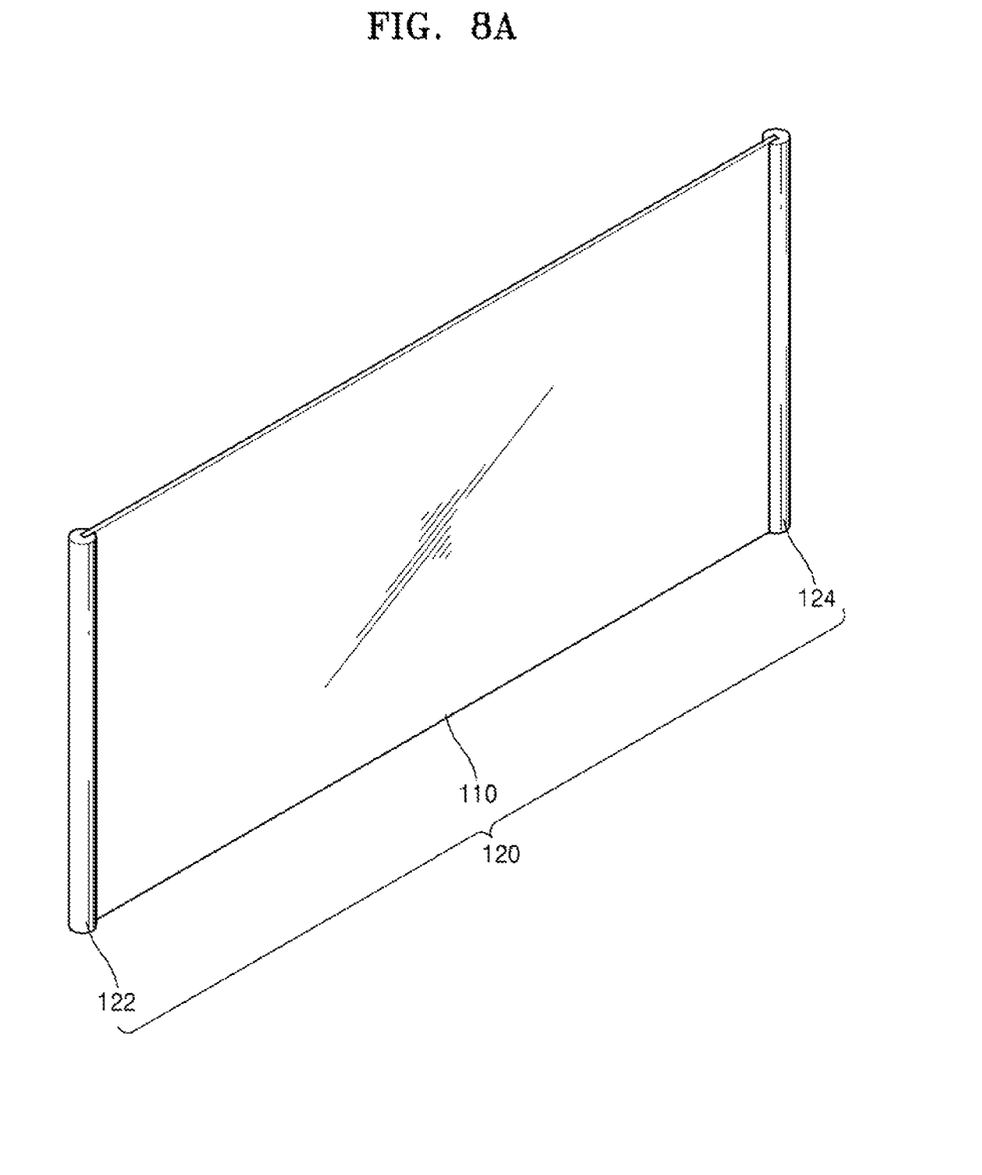
FIG. 8A is a view schematically illustrating the flexible display apparatus that is unbent, according to an embodiment of the present invention.
Figure 8B:
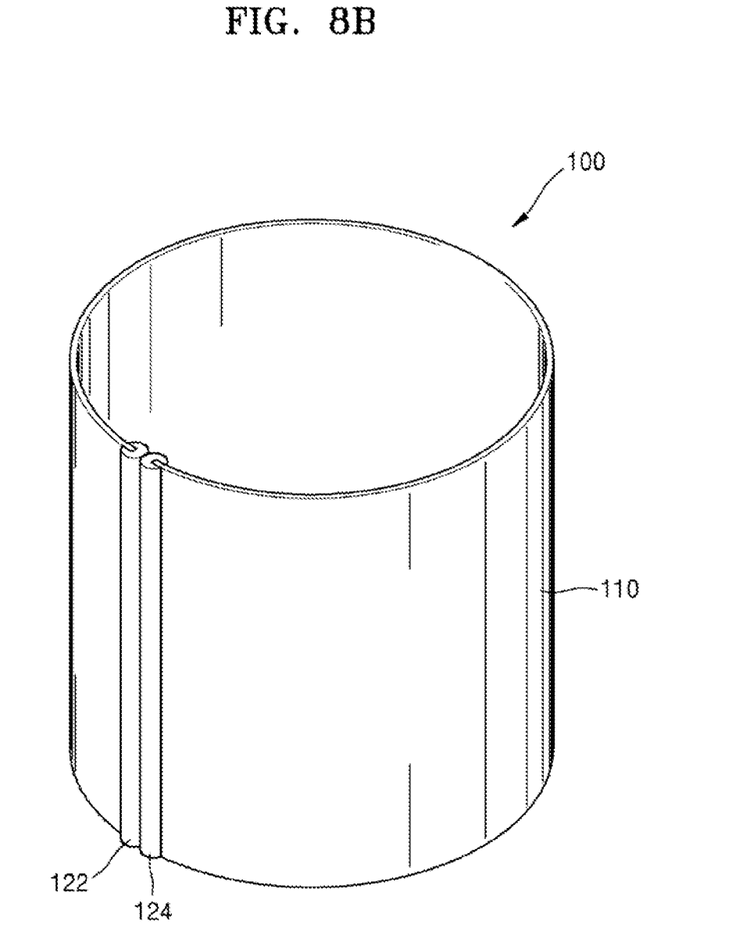
FIG. 8B is a view schematically illustrating the flexible display apparatus with edges that are connected to each other, according to an embodiment of the present invention.

FIG. 8A is a view schematically illustrating the flexible display apparatus 100 that is unbent, according to an embodiment of the present invention, and FIG. 8B is a view schematically illustrating the flexible display apparatus 100 with edges that are connected to each other, according to an embodiment of the present invention.

As shown in FIG. 8A, when the distance between the transmitter 122 and the receiver 124 are equal to or higher than a predetermined distance, the controller 140 may set the mode of the flexible display apparatus 100 to a mobile terminal mode. Also, as shown in FIG. 8B, when the edges of the flexible display apparatus 100 are connected to (or disposed very close to) each other, i.e., when the distance between the transmitter 122 and the receiver 124 is less than the predetermined distance, the controller 140 may set the mode of the flexible display apparatus 100 to a clock mode.

Alternatively, when the flexible display apparatus 100 is connected to the external apparatus, the controller 140 may set the mode to a communication mode to communicate with the external apparatus, or set the mode such that the display unit 110 and a display unit of the external apparatus are combined in one screen.

Figure 9:
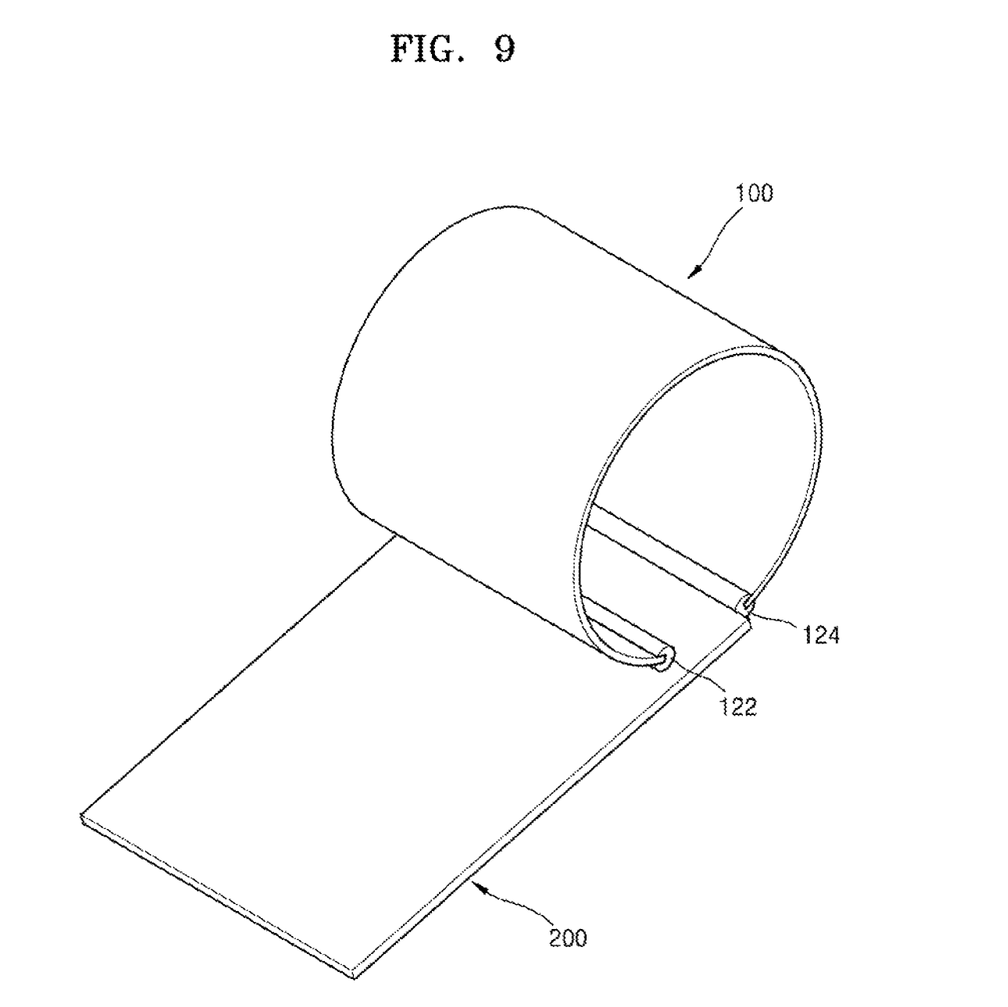
FIG. 9 is a view schematically illustrating the flexible display apparatus and an external apparatus, which are connected to each other, according to an embodiment of the present invention.

FIG. 9 is a view schematically illustrating the flexible display apparatus 100 and an external apparatus 200, which are connected to each other, according to an embodiment of the present invention.

When the flexible display apparatus 100 and the external apparatus 200 are connected to each other as the flexible display apparatus 100 is bent, and thus the distance between the edges of the flexible display apparatus 100 is less than or equal to a predetermined distance, the controller 140 may set a communication mode for the flexible display apparatus 100 to communicate with the external apparatus 200.

As described above, a flexible display apparatus may use a proximity touch as a user interface by detecting an approach of an object, by disposing a sensor in a region adjacent to a display unit or on the display unit.

Also, by disposing a slab unit having a curvature along one direction of the display unit, the flexible display apparatus may be easily deformed.

Also, since a bending degree of the display unit is used as a user interface, a user may dynamically manipulate the flexible display apparatus.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flexible display apparatus, comprising:
a display unit that is flexible and displays an image; and
a sensor including a transmitter transmitting a sensing signal, the transmitter disposed at a first edge of the display unit, the sensor detecting an approach of an object into a sensing region that is a space formed between the first edge and a second edge of the display unit, the sensing region being formed only when the display unit is bent, the second edge facing the first edge when the display unit is bent.

2. The flexible display apparatus of claim 1, wherein the sensor receives the sensing signal.

3. The flexible display apparatus of claim 1, wherein the sensor comprises a receiver disposed at the second edge of the display unit for receiving the sensing signal or wherein the sensor receives the sensing signal reflected by the object.

4. The flexible display apparatus of claim 1, further comprising a reflector disposed at the second edge of the display unit for reflecting the sensing signal.

5. The flexible display apparatus of claim 1, further comprising a determiner for determining at least one of the approach of the object based on the transmitted sensing signal and the received sensing signal, an approach location of the object, and a bending degree of the display unit, wherein the determiner performs the determination by using at least one of a transmission time of the sensing signal, a reception time of the sensing signal, a strength of the transmitted sensing signal, and a strength of the received sensing signal.

6. The flexible display apparatus of claim 1, further comprising a controller for controlling the display unit by recognizing the approach of the object as a user interface, wherein the display unit changes an image displayed on the display unit or ends an image display when the object intrudes into the sending region.

7. The flexible display apparatus of claim 1, wherein the sensor comprises:
a first sensor including the transmitter disposed at the first edge of the display unit; and
a second sensor including a transmitter disposed between the first sensor and a center of the display unit, the second sensor detecting the approach of the object into a bent space that is a space enclosed by the sensing region and the display unit when the display unit is bent.

8. The flexible display apparatus of claim 7, wherein an approach depth of the object is detected by the first and second sensors.

9. The flexible display apparatus of claim 1, further comprising a slab unit bending with the display unit, the slab unit adhering to one surface of the display unit and having a curvature according to one direction.

10. The flexible display apparatus of claim 9, wherein the slab unit comprises a shape variation unit for maintaining a streamlined cross section even when the display unit is unbent.

11. The flexible display apparatus of claim 10, wherein a center of the shape variation unit matches a center of the display unit.

12. A method of operating a flexible display apparatus, the method comprising:
detecting an approach of an object to a bent space of a display unit of the flexible display apparatus, the bent space being formed only when the display unit is bent, the bent space being a space enclosed by a sensing region and the display unit, the sensing region being a space formed between a first edge of the display unit and a second edge of the display unit, the second edge facing the first edge when the display unit is bent; and
changing an image displayed on the display unit or ending an image display on the display unit when it is determined that the object intrudes into the bent space.

13. The method of claim 12, wherein the detecting the approach of an object comprises detecting an approach depth of the object.

14. The method of claim 12, the method further comprising:

detecting a distance between an edge of a display unit of the flexible display apparatus and a predetermined region of the display unit when the display unit is bent.

15. A flexible display apparatus comprising:

a display unit that displays an image and is flexible;

a sensor including a transmitter transmitting a sensing signal, the transmitter disposed at an edge of the display unit, the sensor detecting a distance between the edge and a predetermined region of the display unit only when the display unit is bent, the predetermined region facing the edge when the display unit is bent; and     a controller for changing an image displayed on the display unit or ending display of the image when the distance is less than or equal to a predetermined distance.

16. The flexible display apparatus of claim 15, wherein the predetermined region of the display unit is another edge of the display unit.

17. The flexible display apparatus of claim 15, wherein the sensor receives the transmitted sensing signal.

18. The flexible display apparatus of claim 17, wherein the sensor comprises:

a receiver disposed at another edge of the display unit, said another edge of the display unit facing the edge of the display unit when the display unit is bent.

19. The flexible display apparatus of claim 18, wherein the sensor receives the sensing signal reflected by the object.

20. The flexible display apparatus of claim 15, wherein the predetermined distance is a half of a distance between the edge and said another edge when the display unit is unbent.

\* \* \* \* \*